United States Patent
Wang et al.

(10) Patent No.: US 6,826,105 B2
(45) Date of Patent: Nov. 30, 2004

(54) REFRESH-FREE ULTRA LOW POWER PSEUDO DRAM

(75) Inventors: Chih-Hsien Wang, Hsin-Chu (TW); Doung-Her Tsai, Hsin-Chu (TW)

(73) Assignee: Brilliance Semiconductor, Inc., Hsin-Chu (TW)

(*) Notice: Subject to any disclaimer, the term of this patent is extended or adjusted under 35 U.S.C. 154(b) by 34 days.

(21) Appl. No.: 10/305,143

(22) Filed: Nov. 27, 2002

(65) Prior Publication Data

US 2004/0042273 A1 Mar. 4, 2004

(30) Foreign Application Priority Data

Aug. 28, 2002 (TW) .................................. 91119539 A

(51) Int. Cl.[7] .............................................. G11C 7/00
(52) U.S. Cl. .................. 365/222; 365/230.03; 365/233
(58) Field of Search .......................... 365/230.03, 191, 365/233, 189.03, 189.08, 218, 222

(56) References Cited

U.S. PATENT DOCUMENTS

| | | | | |
|---|---|---|---|---|
| 6,108,262 A | * | 8/2000 | Itoh et al. ................... 365/229 |
| 6,246,614 B1 | * | 6/2001 | Ooishi ........................ 365/191 |
| 6,463,002 B2 | * | 10/2002 | Kim et al. .................. 365/222 |
| 6,625,077 B2 | * | 9/2003 | Chen .......................... 365/222 |
| 6,636,454 B2 | * | 10/2003 | Fujino et al. .......... 365/230.08 |
| 6,721,224 B2 | * | 4/2004 | Eaton et al. ................ 365/222 |

* cited by examiner

*Primary Examiner*—Richard Elms
*Assistant Examiner*—Hien Nguyen
(74) *Attorney, Agent, or Firm*—Birch, Stewart, Kolasch & Birch, LLP

(57) ABSTRACT

A refresh-free ultra-low power pseudo dynamic random access memory (DRAM). A clock that controls a DRAM is used to perform 1-bit read, 1-bit write, or a non-read and non-write operation. The clock includes a first read signal, a first write signal, or a first non-read and non-write signal. An interface circuit generates a second read signal, a second write signal, or a second non-read and non-write signal according to the first read signal, the first write signal, or the first non-read and non-write signal, respectively. A static random access memory (SRAM) cell is coupled with the interface circuit for performing the 1-bit read according to the second read signal, the 1-bit write according to the second write signal, or the non-read and non-write operation according to the non-read and non-write signal.

18 Claims, 3 Drawing Sheets

REFRESH-FREE ULTRA LOW POWER PSEUDO DRAM

BACKGROUND OF THE INVENTION

1. Field of Invention

The invention relates to a dynamic random access memory (DRAM) and, in particular, to a refresh-free ultra-low power pseudo DRAM. Such low power products include computer, cell phones, personal digital assistants (PDA's), digital set-up box, satellite positioning systems, consumption IC's (TV's and Game Boys).

2. Related Art

The volatile memories are classified by two types: static random access memory (SRAM) and dynamic random access memory (DRAM). The one-bit cell of SRAM comprises four or six transistors, while one-bit cell of DRAM is comprised of one transistor and one capacitor.

The capacitor of the DRAM needs to be refreshed and charged repeatedly in order to ensure the data storage. The SRAM, on the other hand, is faster in it processing speed and more stable than the usual DRAM. The word "static" means that the data can be stored for a long period without charging the memory cell. Because of this special property, the SRAM is often used as a buffer memory. Generally speaking, the SRAM is used as a buffer memory, whereas the DRAM plays the role of main memory.

However, as the semiconductor manufacturing technology enters into the nanometer scale, the existing DRAM memory cell consisting of one transistor and one capacitor faces with challenges from the physical limitation of semiconductor devices and the manufacturing limitation for semiconductor capacitors. For example, the capacitor of the available memory cell of DRAM has a more serious problem in leakage current than the transistor. The size of the memory cell will be also affected by the physical properties of semiconductor devices.

Therefore, it is thus highly desirable to provide a new technique for the nanometer semiconductor manufacturing technology to overcome the leakage current problem of the capacitor of the memory cell and the physical limitations of semiconductor devices.

SUMMARY OF THE INVENTION

In view of the foregoing problems, it is an objective of the invention to provide a refresh-free DRAM, which uses the memory cells of the SRAM to store data without charging, in replace of DRAM that require to be changed constantly to maintain the data.

Another objective of the invention is to provide an ultra-low power DRAM, which utilizes the low power characteristics of the memory cells of SRAM to reduce the power consumption.

A further objective of the invention is to provide a pseudo DRAM, which uses memory cells of SRAM to substitute for the memory cells of DRAM. An interface control circuit converts a clock for controlling the DRAM into a clock for controlling the SRAM. so that the clock of the SRAM is compatible with DRAM in timing control.

To achieve the above objective, the disclosed refresh-free ultra-low power pseudo DRAM performs a 1-bit read, a 1-bit write, and a non-read and non-write operation according to a clock for controlling the DRAM. It includes one interface control circuit and a SRAM memory cells. An interface control circuit generates a second read-out signal, a second write signal or a second non-read and non-write signal according to the first read-out signal, the first write signal, or the first non-read and non-write signal, respectively. A static random access memory (SRAM) cell is coupled with the interface control circuit for performing the 1-bit read-out according to the second read-out signal, the 1-bit write according to the second write signal, or the non-read and non-write operation according to the non-read and non-write signal.

DETAILED DESCRIPTION OF THE INVENTION

The specifications of known DRAM's include the fast page mode (FPM), the extended data out (EDO), the syncbronous DRAM (SDRAM), the double data rate (DDR), the double data rate II (DDRII), the direct Rambus DRAM (DRDRAM). These DRAM's are developed for compute systems with different speeds and operating structures.

According to the disclosed memory cell of the invention, an interface circuit is provided for converting the clock of different specifications for the above-mentioned DRAM into three different operating modes of a SRAM cell. Three operation modes of a SRAM cell are read mode, write mode and mon-read and non-write mode. A 1-bit data is written in the cell when the write mode is selected while an 1-bit data is read out when the read mode is selected. The SRAM cell is disabled when the not-selected(V1.0) mode is enabled. The SRAM cell is composed of four transistors or six transistors. A high-density pseudo DRAM with features of low power consumption, high efficiency and compatibility is characteristic by the combination of the interface circuit and the SRAM memory cell.

Figure 1:
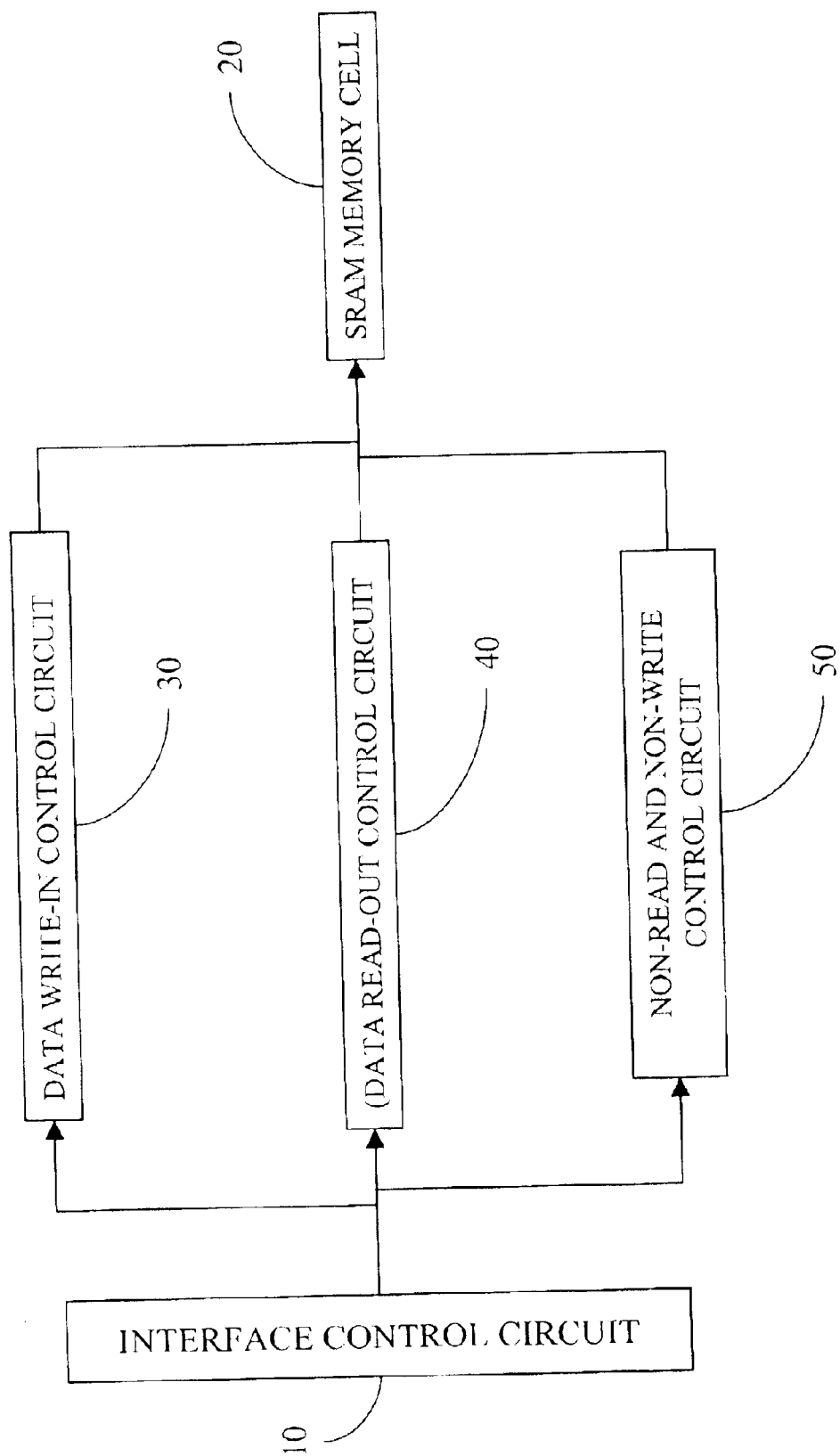
FIG. 1 is a circuit block diagram of the disclosed refresh-free ultra-low power pseudo DRAM memory cell.

With reference to FIG. 1, the disclosed refresh-free ultra-low power pseudo DRAM contains an interface circuit 10 and an SRAM memory cell 20.

The interface circuit 10 generates operation signals of the SRAM memory cell 20 in response to the clock of a DRAM. The operation signals include a read signal, a write signal, or a non-read and non-write signals. The SRAM memory cell 20 accordingly performs the 1-bit read operation response to the read signal, the 1-bit write operation in response to the write signal, or the non-read and non-write operation in response to the not-selected signal.

The Truth-Table shows in follows:

TABLE 1

| MODE | $\overline{WEs}$ | $\overline{CEs}$ | $\overline{OEs}$ |
|---|---|---|---|
| Not Read and Not Write | X | H | X |
|  | H | L | H |
| Read | H | L | L |
| Write | L | L | X |

Wherein the $\overline{WEs}$ s Write Enable Input signal, $\overline{CEs}$ is Chip Enable Output signal and $\overline{OEs}$ is Output Enable nput signal.

The SRAM memory cell 20 has a structure that uses four or six transistors to store one bit of data. The transistors are metal oxide semiconductor field effect transistors (MOSFET's). They can be P-type of N type MOSFET's.

Generally speaking, aside from the addressing circuits and data bus, the SRAM memory cell 20 also contains three other sets of control circuits. As shown in the drawing, they are the write circuit 30, the read circuit 40, and the not-selected circuit 50. When writing data to the SRAM memory cell 20, the write circuit 30 is enabled so that data is written to the SRAM memory cell 20. When data is read from the SRAM 20, the read circuit 40 is enabled so that data is read from the SRAM memory cell 20. When the SRAM memory cell 20 is performing data read or write, the non-read and non-write circuit 50 is not enabled for ensuring the SRAM memory cell 20 to perform normal read and write operations. When the non-read and non-write circuit 50 is enabled, the SRAM memory cell 20 performs neither read operation nor write operation.

The clock of a DRAM includes operation signals of memory cell. The operation signals includes a first read signal, a first write signal, or a first non-read and non-write signal. The first read signal enabled the memory cell to perform a 1-bit data read operation. The first write signal enables the memory cell to perform a 1-bit data write operation. The first non-read and non-write signal keeps the memory cell at a high resistance state so that no read or write operation is performed.

Take a clock of an SDRAM for example. When the interface circuit 10 detects a first write signal in the clock of an SDRAM, it generates a second write signal according to the first write signal, enabling the write circuit 30 of the SRAM memory cell 20. A 1-bit data is then written to the SRAM memory cell 20. In this case, the non-read and non-write circuit 50 is not enabled.

Figure 2:
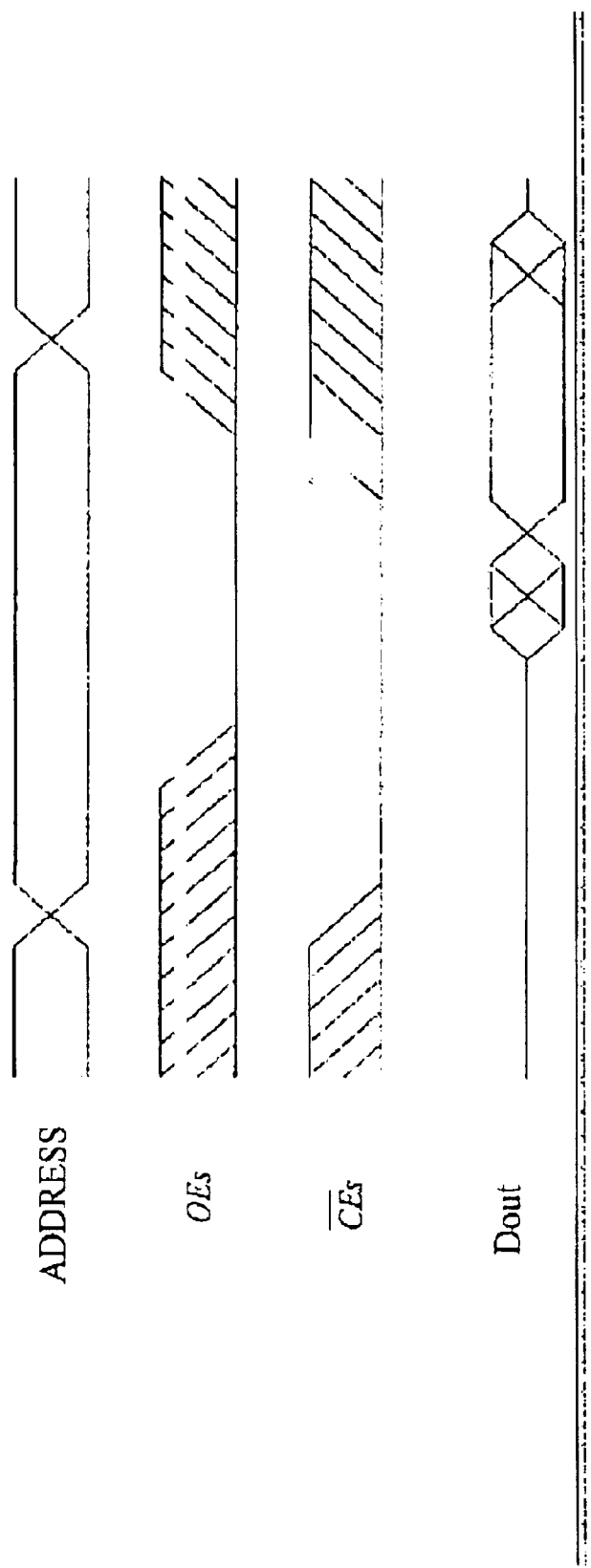
FIG. 2 is a wavefor, as diagram of the SRAM when reading.
Figure 3:
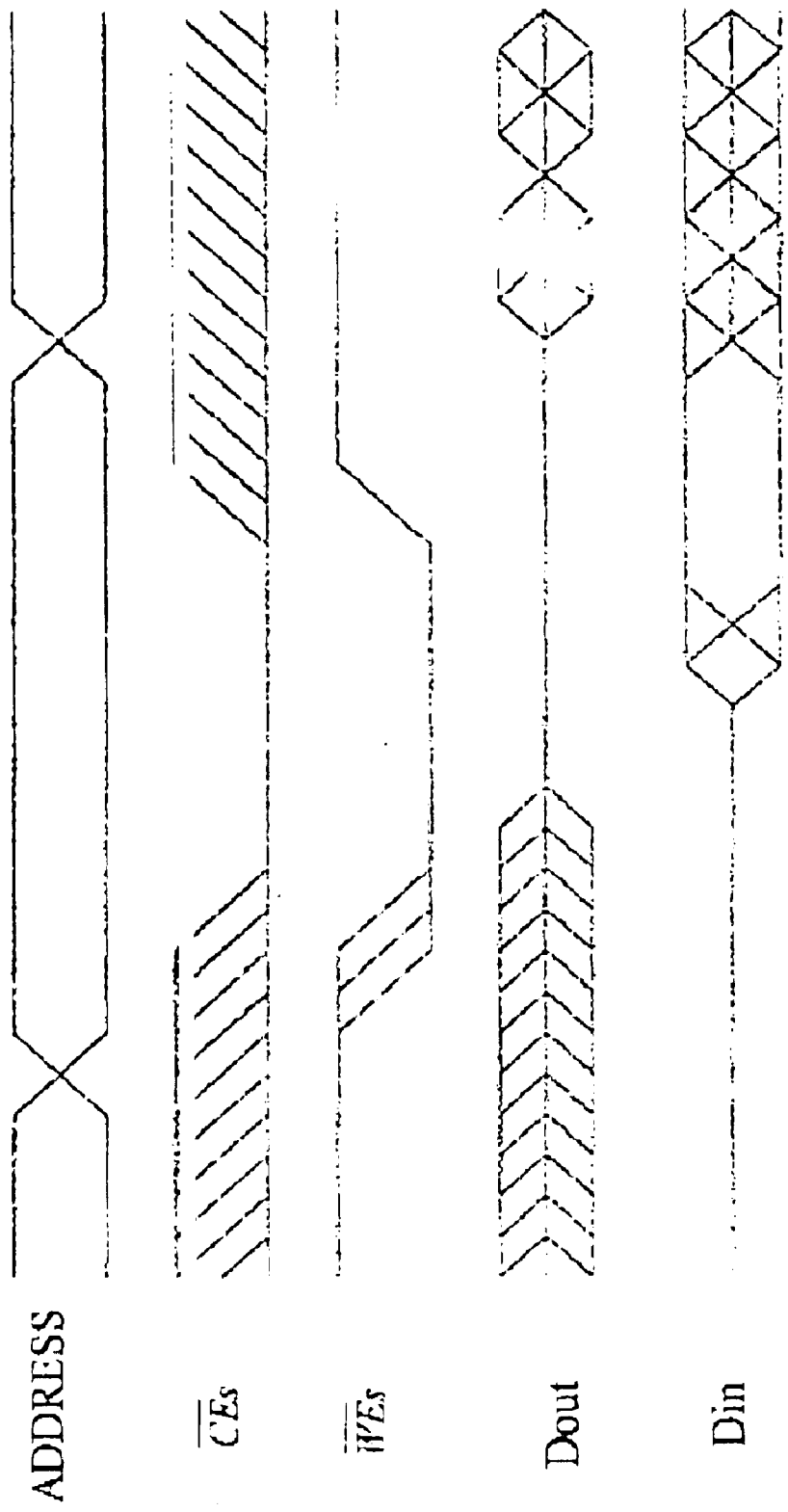
FIG. 3 is a wavefor, as diagram of the SRAM when writing.

For example, the read cycle (clock) of the SRAM is shows in FIG. 2, and the write cycle (clock) of the SRAM is shows in FIG. 3.

When the interface circuit 10 detects a first read signal in the clock of an SDRAM, it generates a second read signal according to the first read signal, enabling the read circuit 40 of the SRAM memory cell 20. A 1-bit data is then read from the SRAM memory cell 20. Analogously, the non-read and non-write circuit 50 is not enabled When the interface circuit detects a first non-read and non-write signal in the clock of an SDRAM, the interface circuit 10 generates a second non-read and non-write signal according to the first non-read and non-write signal, enabling the non-read and non-write circuit 50 of the SRAM memory cell 20. The SRAM memory cell 20 is then in the disabled high-resistance state.

The invention use the advanced manometer manufacturing technology to implement low-power and high-efficiency pseudo DRAM cell structure. The cell structure uses four or six transistors as a 1-bit storage structure. Through a proper design of the circuit, the control signals in the clock of synchronous, double data rate and double data rate II DRAM's are converted into the read write, non-read and non-write control modes. These modes control the memory cell so that the invention can still make use of the existing DRAM'S.

The transistor used in the invention can be N-type MOS or P-type MOS. Based upon the peripheral circuit elements, the semiconductor manufacturing parameters such as the threshold voltage Vt, for adjusting ion implantation can be tuned to change the properties of the four or six transistors for different applications. The invention has the advantages of high compatibility and easy implementation in semiconductor manufacturing processes. Compared with the memory cell structures and circuit designs of existing DRAM's, the invention has lower power consumption and a simpler circuit design.

Furthermore, since the invention uses the semiconductor manometer technology compatible with normal logic products, it can be easily applied to integrate logic products such as digital signal processing (DSP) chips, graphics chips, microcontrollers onto the same chip. Therefore, it is conformed to the "silicon on chip" (SOC) trend for integrated circuits (IC's).

While this invention has been particularly shown and described with references to preferred embodiments thereof, it will be understood by those skilled in the art that various changes in form and details may be made therein without departing from the spirit and scope of the invention as defined by the appended claims.

What is claimed is:

1. A refresh-free ultra-low power pseudo DRAM (Dynamic Random Access Memory) for performing a 1-bit read, 1-bit write, and a non-read and non-write operation according to the clock that controls a DRAM, the clock containing a first signal selected from a first read signal, a first write signal and a non-read and non-write signal, the refresh-free ultra-low power pseudo DRAM comprising:

an interface circuit, which generates a second read signal, a second write signal, and a second non-read and non-write signal in response to the first signal selected from the first read signal, the first write signal, and the first non-read and non-write signal, respectively; and an SRAM (Static Random Access Memory) memory cell, which is coupled with the interface circuit for performing the 1-bit read operation, the 1-bit write operation, and the non-read and non-write operation according to the second read signal, the second write signal, and the second non-read and non-write signal, respectively.

2. The refresh-free ultra-low power pseudo DRAM of claim 1, wherein the SRAM memory contains a write circuit for writing the 1-bit data into the SRAM memory cell.

3. The refresh-free ultra-low power pseudo DRAM of claim 1, wherein the SRAM memory cell contains a read circuit for reading the 1-bit data from the SRAM memory cell.

4. The refresh-free ultra-low power pseudo DRAM of claim 1, wherein the SRAM memory contains a non-read and non-write circuit for disabling the SRAM memory cell when it is enabled.

5. The refresh-free ultra-low power pseudo DRAM of claim 1, wherein the SRAM memory contains six transistors.

6. The refresh-free ultra-low power pseudo DRAM of claim 5, wherein the transistor is a metal oxide semiconductor field effect transistor (MOSFET).

7. The refresh-free ultra-low power pseudo DRAM of claim 1, wherein the SRAM contains four transistors.

8. The refresh-free ultra-low power pseudo DRAM of claim 7, wherein the transistor is a metal oxide semiconductor field effect transistor (MOSFET).

9. The refresh-free ultra-low power pseudo DRAM of claim 1, wherein the DRAM is selected from one of the group consisting of fast page mode (FPM) DRAM, extended data out (EDO) DRAM, synchronous DRAM (SDRAM), double data rate (DDR) DRAM, double data rate II (DDRII DRAM, and direct Rambus DRAM (DRDAM).

10. A refresh-free ultra-low power pseudo DRAM (Dynamic Random Access Memory) memory cell for performing a 1-bit read, 1-bit write, and a non-read and non-write operation according to the clock that controls a DRAM, the clock containing a first signal selected from a first read signal, a first write signal and a non-read and non-write signal, the refresh-free ultra-low power pseudo DRAM memory cell comprising:

an interface circuit, which generates a second read signal, a second write signal and a second non-read and non-write signal in response to the first signal selected from the first read signal, the first write signal, and the first non-read and non-write signal, respectively;

a write circuit, which is coupled with the interface circuit;

a read circuit, which is coupled with the interface circuit;

a non-read and non-write circuit, which is coupled with the interface circuit; and a SRAM memory cell, which is coupled with the write control circuit, the read control circuit, and the non-read and non-write circuit;

wherein the second write signal output from the interface circuit enables the write control circuit so that the SRAM memory cell performs the 1-bit write operation, the second read signal output from the interface circuit enables the read control circuit so that the SRAM memory cell performs the 1-bit read operation, and the second non-read and non-write signal output from the interface circuit enables the non-read and non-write circuit so that the SRAM memory cell enters a disabled state.

11. The refresh-free ultra-low power pseudo DRAM memory cell of claim 10, wherein the non-read and non-write circuit is in the disabled state when the SRAM memory performs the 1-bit write operation.

12. The refresh-free ultra-low power pseudo DRAM memory cell of claim 10, wherein the non-read and non-write circuit is in the disabled state when the SRAM memory performs the 1-bit read operation.

13. The refresh-free ultra-low power pseudo DRAM memory cell of claim 10, wherein the SRAM memory contains six transistors.

14. The refresh-free ultra-low power pseudo DRAM memory cell of claim 13, wherein the transistor is a metal oxide semiconductor field effect transistor (MOSFET).

15. The refresh-free ultra-low power pseudo DRAM memory cell of claim 10, wherein the SRAM memory contains four transistors.

16. The refresh-free ultra-low power pseudo DRAM memory cell of claim 15, wherein the transistor is a metal oxide semiconductor field effect transistor (MOSFET).

17. The refresh-free ultra-low power pseudo DRAM memory cell of claim 10, wherein the DRAM is selected from one of the group consisting of fast page mode (FPM) DRAM, extended data out (EDO) DRAM, synchronous DRAM (SDRAM), double data rate (DDR) DRAM, double data rate II (DDRII) DRAM, and direct Pambus DRAM (DRDRAM).

18. A refresh-free ultra-low power pseudo DRAM (Dynamic Random Access Memory) memory cell comprising:

an interface circuit;

a write circuit, which is coupled with the interface circuit;

a read circuit, which is coupled with the interface circuit;

a non-read and non-write circuit, which is coupled with the interface circuit; and a SRAM memory cell, which is coupled with the write control circuit, the read control circuit, and the non-read and non-write circuit.

* * * * *